United States Patent [19]
Tran et al.

[11] Patent Number: 5,893,539
[45] Date of Patent: Apr. 13, 1999

[54] CABLE MANAGEMENT SYSTEM

[75] Inventors: Bao Quoc Tran, San Diego; Nancy McCreary, Escondido; Milton E. Norman, Jr., Fallbrook, all of Calif.

[73] Assignee: NCR Corporation, Dayton, Ohio

[21] Appl. No.: 08/937,632

[22] Filed: Sep. 25, 1997

[51] Int. Cl.⁶ ......................................... F16L 3/22
[52] U.S. Cl. ............... 248/68.1; 248/282.1; 312/223.6; 312/319.2
[58] Field of Search ............... 248/49, 58, 68.1, 248/69, 282.1; 221/26; 312/223.1, 223.6, 319.2, 319.3

[56] References Cited

U.S. PATENT DOCUMENTS

| | | | |
|---|---|---|---|
| 818,982 | 4/1906 | Skelley | 248/282.1 |
| 3,233,850 | 2/1966 | Merker et al. | 248/49 |
| 4,582,281 | 4/1986 | Van Camp | 248/49 |
| 4,676,472 | 6/1987 | Kamrud, Sr. | 248/68.1 |
| 5,233,881 | 8/1993 | Sayen et al. | 248/68.1 |
| 5,533,797 | 7/1996 | Gelber | 312/138.1 |
| 5,564,658 | 10/1996 | Rinderer | 248/49 |
| 5,683,065 | 11/1997 | Allen | 248/282.1 |
| 5,740,994 | 4/1998 | Laughlin | 248/68.1 |

*Primary Examiner*—Ramon O. Ramirez
*Assistant Examiner*—Robert Lipcsik
*Attorney, Agent, or Firm*—Gates & Cooper

[57] ABSTRACT

A harness device which includes an elongated arm and affixed in spaced locations. G or C-shaped guides for receiving cables loosely and/or in a bound fashion within the guide. The arm has a spring mounted hinge whereby the arm is essentially two components, the spring mounted hinge urges the two components towards a folded closure position. In this manner, cables for electronic components such as elements of a computer can be neatly and conveniently housed in a cabinet.

10 Claims, 4 Drawing Sheets

CABLE MANAGEMENT SYSTEM

BACKGROUND OF THE INVENTION

Having a convenient way for storing cables neatly and accessibly in an electronic cabinet, such as a computer cabinet is valuable.

This invention relates to a cable management system, particularly a cable harnessing system for managing multiple cables in electronic cabinets. In particular, it relates to a system whereby the cables can be conveniently accessed, separated or stored as required.

In electronic cabinets such as computer cabinets, there are usually multiple cables which lead power and signals between components in the cabinet. It is usually necessary to access the cabinet through different doors so that components can be serviced, removed, replaced and added multiple times during the operation of the electronics in the cabinet. There is a need to provide a simple, convenient and easy manner for managing these cables in a neat fashion and for separating and isolating and removing selected cables. One conventional way for handling these cables is to have a permanent strap for tying cables to different portions of the cabinet. A problem with this approach is that every time a particular cable needs to be selected or removed, the permanent tie has to be undone.

There is a need to provide a system for enhanced cabling handling.

SUMMARY OF THE INVENTION

By this invention there is provided a cable harnessing system which substantially minimizes the current problems of cable handling.

According to the invention, the harness device for holding multiple cables in an electronic cabinet such as a computer cabinet comprises an elongated arm for attachment to the cabinet. The arm has a length. At least two guides are permanently attached to the arm in spaced relationship along the length. In this manner, there is provided an elongated arm with spaced guides along the arm for directing cables along the length of the arm. The guide has a mouth for receiving multiple cables directed along the guide length. The cables can be selectively removed or added into the guide so that the cables can extend along the length of the arm.

In the preferred form of the invention, the guide is substantially G-shaped or C-shaped in profile and cables can be added to fit into the guide either loosely or bound to a portion of the guide as required.

In another preferred form of the invention, the arm is constituted by at least two components which are articulatedly hinged together and are biased towards a folded position which is overlapping.

The invention is further described with reference to the accompanying drawings.

DETAILED DESCRIPTION OF THE PREFERRED EMBODIMENT

A harness device 10 for holding multiple cables 11 is provided for location in a electronic or computer cabinet 12. The cabinet includes a vertical side wall or bar 13 on which the harness device 10 is mounted.

Figure 1:
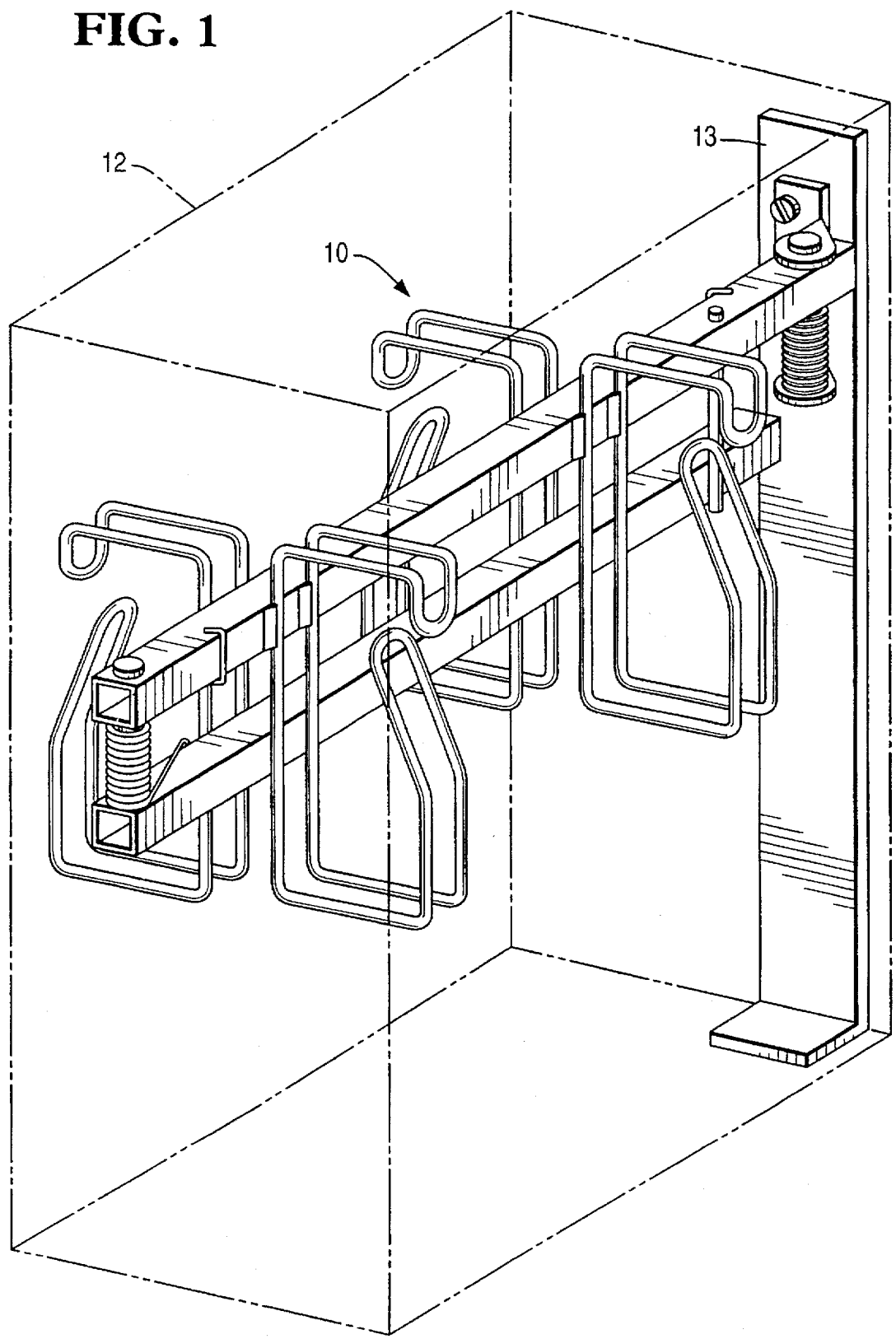
FIG. 1 is a perspective view showing a cabinet with a harness device connected in the cabinet and mounted on a vertical bar in the cabinet.
Figure 2:
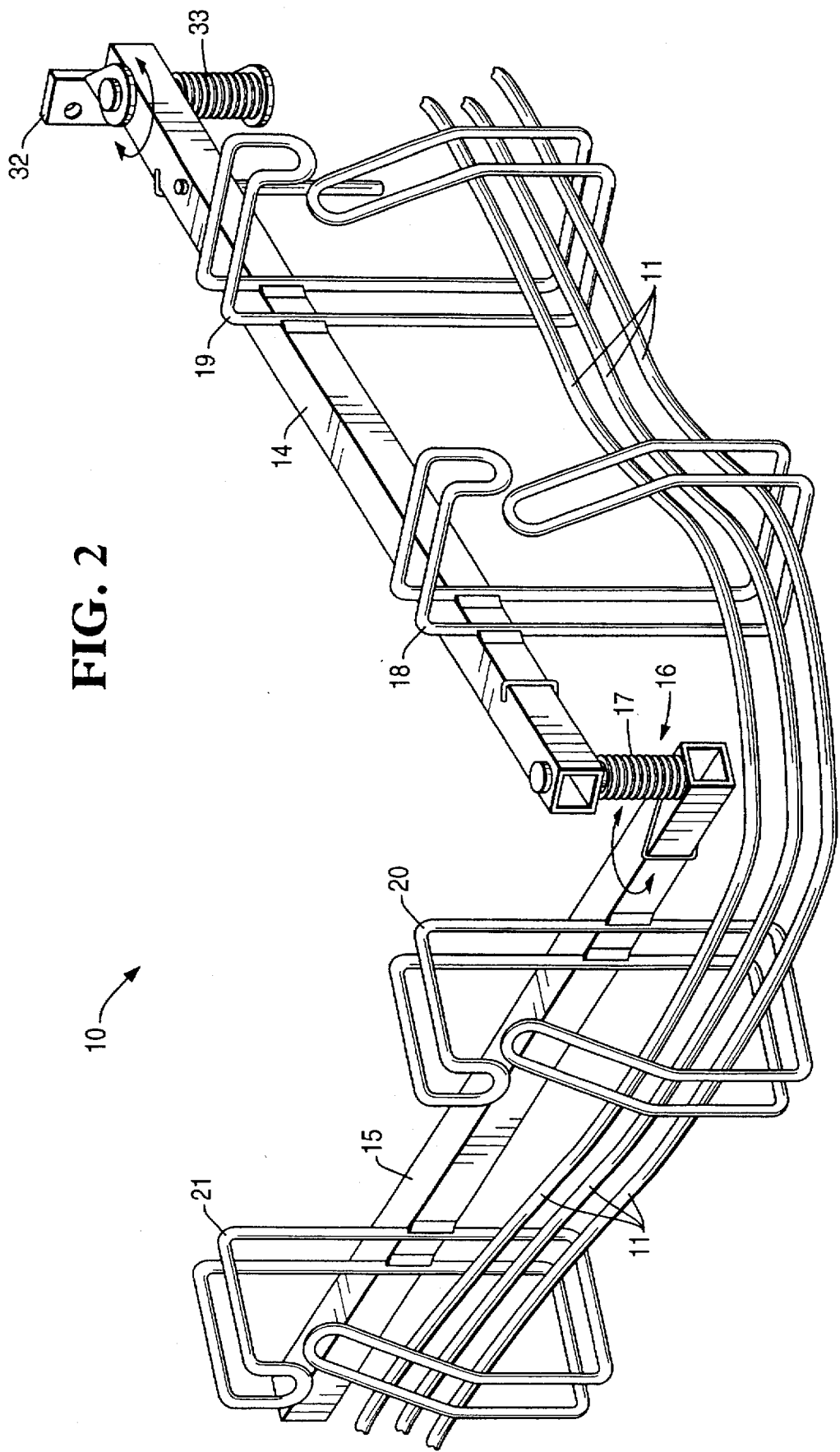
FIG. 2 is an enlarged perspective view of the harness device showing the two components in a relatively open relationship with cables running through the guides.
Figure 4:
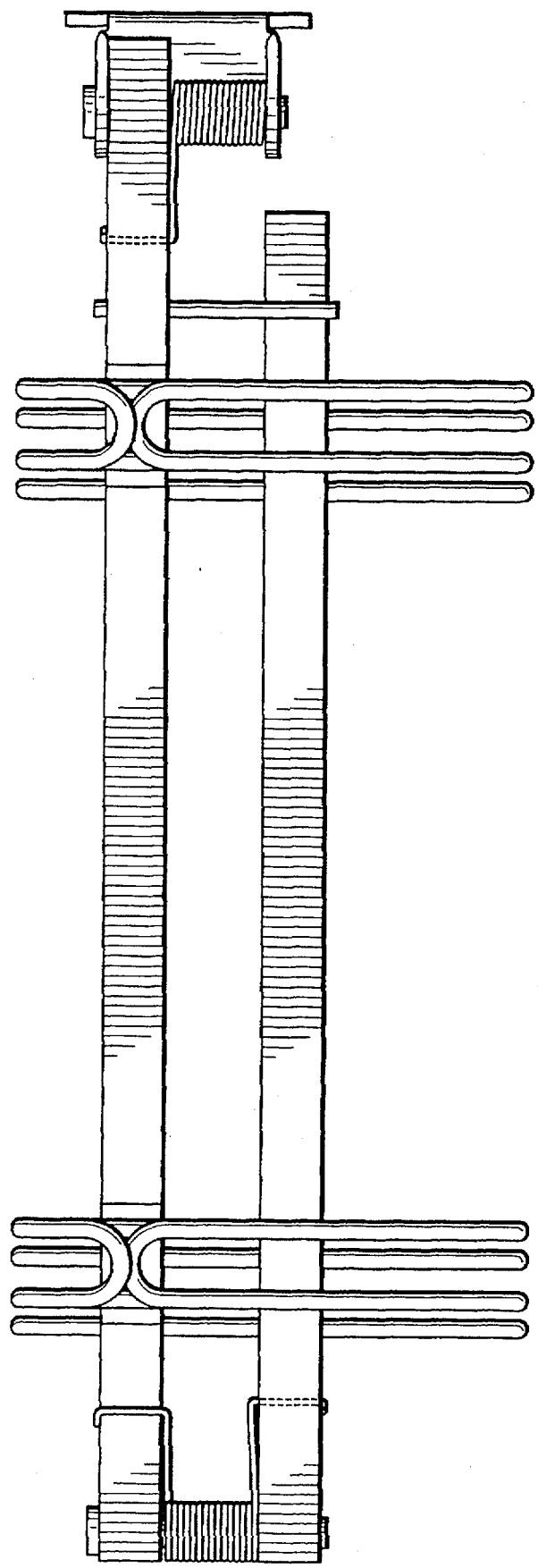
FIG. 4 is a side view of the arms in a closed, folded position.

The harness device 10 includes two elongated components 14 and 15, respectively, which are articulated relative to each other and hingedly connected in the area 16. The hinged connection includes a spring 17 which biases the two components 14 and 15 towards relative folded or closure position such that they are in overlapping relationship as illustrated in FIGS. 1 and 4.

Figure 3:
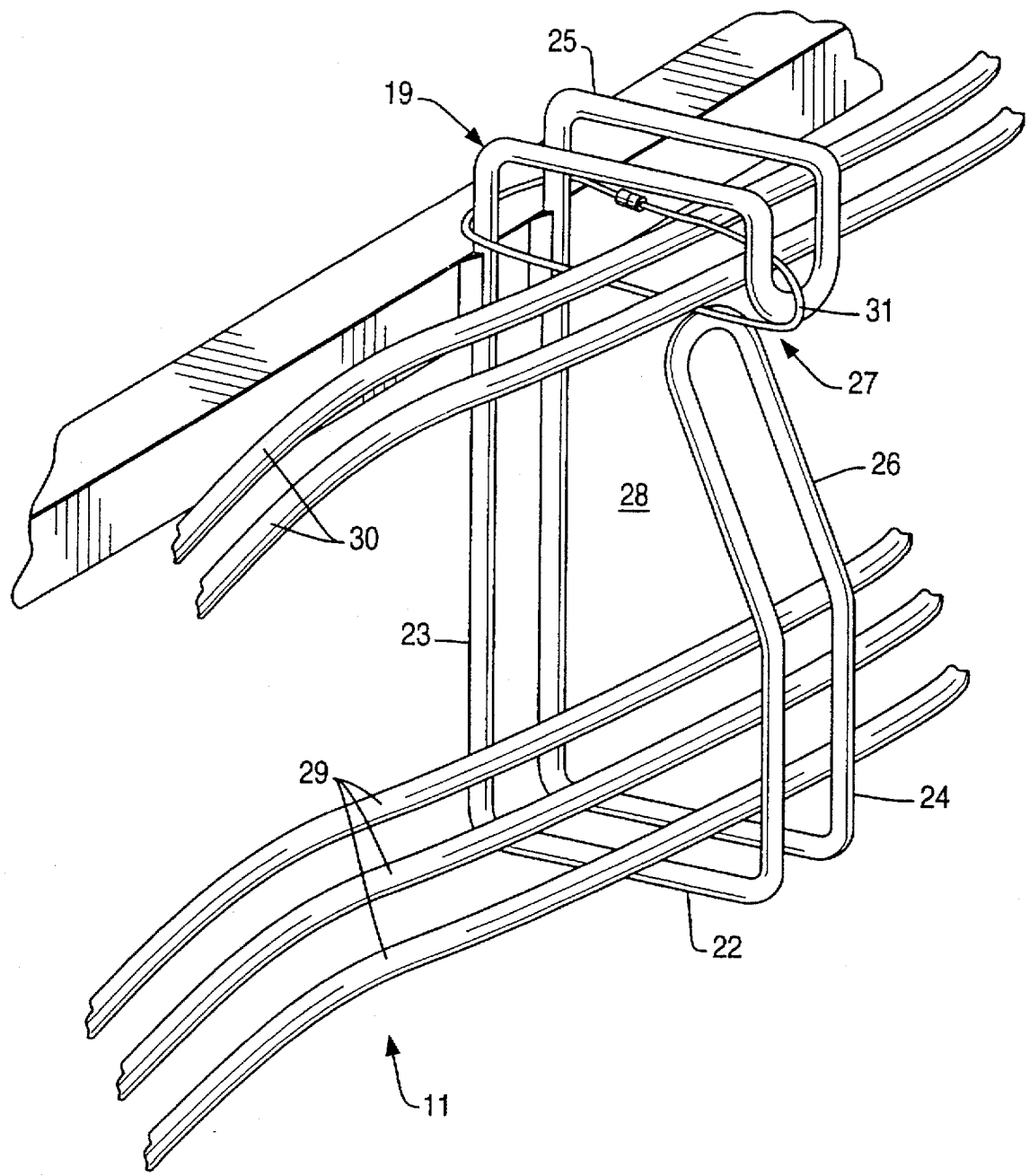
FIG. 3 is an enlarged perspective view of a guide with cables running through the guide, some of the cables being loosely located and others being bound to a portion of the guide.

Mounted along the elongated length of each of the components 14 and 15 are a pair of guides 18 and 19 on component 14 and 20 and 21 on component 15. The guide 18 as further illustrated in FIG. 3 is substantially circumscribing or C-shaped or G-shaped such that there is a base limb 22, a rear upwardly directed limb 23, a forward upwardly directed limb 24 and a top portion limb 25. There is also an inwardly directed tip portion 26 which extends inwardly towards the interior zone of the guide 19. A mouth area 27 if formed for each guide.

Cables 11 can be connected in the interior area 28 of the guide 19. The cables as illustrated in FIG. 3 are formed of several loosely arranged cables 29 and other cables 30 which are bound through a tie means 31 between the top portion 25 and back wall 23 of the guide. In this manner, cables 29 and 30 can be separated into two different areas within the guide 19. For instance, cables 29 can be data cables and cables 30 can be power cables. Where any one or more or all of the cables 29 need to be removed from the guide 19, the cables can be simply lifted from the base 22 and removed through the mouth 27. This permits for easy handling of the cables 29. Similarly, if any one or more of the cables 30 need to be removed from the guide 19 it is necessary to untie the strap 31 and remove that cable. In other cases, all cables 29 and 30 may be collectively located loosely in the zone 28 of the guide 19. In yet other cases, cables 29 may be bound to one or more of the limbs constituting the guide 19.

At the end of the arm 14, removed from the articulated hinge area 17, there is a mounting bracket 32 and there is a spring 33 which permits for the hinged relationship of arm 14 relative to the bracket 32. Bracket 32 is for affixation to the vertical member 13 and can be located on that vertical member 13 at any desired height.

As can be seen, there are at least two guides in fixed relationship to each of the respective arms 14 and 15. When elongated to extend in a single direction, there are substantially four guides 18, 19, 20 and 21 in a line and the cables are directed in that line fashion from the vertical mounting bracket outwardly as may be required. Because of the hinge relationship at 33 and 17 respectively, the cables can be directed or managed through the arm in any desired manner.

As such, the cable arm assembly or harness device consists of a retractable spring-loaded cable arm with metal guides or rings 18, 19, 20 and 21 welded to it for cable management. The cables 29 and 30 can thus be removed freely through the cabinet without having to attach the cables to dozens of plastic tie straps 31. This saves a great deal of time in the initial assembly of the system and even more when the electrical unit has to be serviced. As such if it is necessary to service even a single cable, it is unnecessary to cut any one or more of the tie straps which would otherwise be used to bundle the cables. Accessibility of cables 29 and 30 is thus substantially improved by the harnessing system of the present invention. Furthermore, since the cable arm 10 is attached to the main chassis rather than individual rack modules, it can be used with any sliding module and can be mounted vertically any where as may be necessary.

Many other examples of the inventions exist each differing from others in matters of detail only. More guides can be provided on each arm. If desired, a mouth closure element can be provided to each guide for completely surrounding cables in the guide. In other cases there can be different configurations or shapes for the guides.

The above specification, examples and data provide a complete description of the manufacture and use of the composition of the invention. Since many embodiments of the invention can be made without departing from the spirit and scope of the invention, the invention resides in the following claims.

What is claimed is:

1. A harness device for holding multiple cables in a cabinet housing for electronic components comprising:

a rigid arm, for attachment to the cabinet, the rigid arm having a length, wherein the rigid arm comprises two sequential rigid components articulated through a hinge and capable of assuming a folded position in a substantially overlapping relationship; and at least one guide attached to the length of the rigid arm, for receiving multiple cables directed along the arm length, the guide having a mouth through which the multiple cables can enter or be removed from the guide such that the cables can extend along the length of the rigid arm.

2. A harness device as claimed in claim 1, wherein the guide is substantially G-shaped in profile such that the cables rest on a base limb of the G.

3. A harness device as claimed in claim 1, wherein the guide is substantially C-shaped in profile such that the cables rest on a base limb of the C.

4. A harness device as claimed in claim 1, wherein the guide includes a substantially circumscribing shape in profile, the shape having a mouth in one side of the guide for entry or removal of the cables, and wherein the cables can be selectively bound to one portion of the circumscribing shape of the guide.

5. A harness device as claimed in claim 1, wherein each component includes at least two guides at a spaced interval along the length.

6. A harness device as claimed in claim 1, wherein the hinge comprises a hinged spring means.

7. A harness device as claimed in claim 1, including a spring mount for attaching the end of the rigid arm to a vertical structure of the cabinet.

8. A harness device for holding multiple cables in a cabinet housing for electronic components comprising:

a rigid arm for attachment to the cabinet, the arm having a length, wherein the rigid arm comprises two sequential rigid components articulated through a hinge and capable of assuming a folded position in a substantially overlapping relationship; and at least two guides, rigidly attached to the arm at a spaced interval along the length of the arm, for receiving multiple cables directed along the arm length, each guide having a mouth for entry and removal of the cables from the guide.

9. A harness device for holding multiple cables in a cabinet housing for electronic components comprising:

a rigid arm for attachment to the cabinet, the arm having a length, wherein the rigid arm comprises two sequential rigid components articulated through a hinge and capable of assuming a folded position in a substantially overlapping relationship; and at least two guides attached to each component of the rigid arm at a spaced interval along the length of the arm, each guide having a substantially circumscribing shape for receiving and removing cables and a mouth through which the cables can enter or be removed from the guide.

10. A harness device as claimed in claim 9, wherein the components are articulated through a hinged means, the hinged means being for directing the components between an opened and a closed folded position in substantially overlapping relationship.

* * * * *